(12) United States Patent
Kund

(10) Patent No.: US 6,359,457 B1
(45) Date of Patent: Mar. 19, 2002

(54) METHOD OF HOLDING A WAFER AND TESTING THE INTEGRATED CIRCUITS ON THE WAFER

(75) Inventor: Michael Kund, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/313,422

(22) Filed: May 17, 1999

(30) Foreign Application Priority Data

May 15, 1998 (DE) .......................... 198 22 000

(51) Int. Cl.⁷ .............................. G01R 31/02
(52) U.S. Cl. .................. 324/760; 324/765; 324/755
(58) Field of Search ................. 324/765, 754, 324/755, 757, 760, 758; 392/416, 418; 374/1, 416; 257/754

(56) References Cited

U.S. PATENT DOCUMENTS

| | | | | |
|---|---|---|---|---|
| 5,654,588 A | * | 8/1997 | Dasse et al. ............. | 257/754 |
| 5,701,666 A | * | 12/1997 | DeJaven et al. ........ | 324/754 X |
| 5,881,208 A | * | 3/1999 | Geyling et al. ............ | 392/418 |
| 6,004,029 A | * | 12/1999 | Moshlehi et al. .............. | 374/1 |

FOREIGN PATENT DOCUMENTS

| | | |
|---|---|---|
| DE | 3213239 C2 | 12/1992 |
| EP | 0465017 A1 | 1/1992 |

OTHER PUBLICATIONS

Published International Applicaton No. 96/11495 (Jelinek), dated Apr. 18, 1996.

* cited by examiner

*Primary Examiner*—Safet Metjahic
*Assistant Examiner*—T. R. Sundaram
(74) *Attorney, Agent, or Firm*—Herbert L. Lerner; Laurence A. Greenberg; Werner H. Stemer

(57) ABSTRACT

A wafer with integrated circuits is held with a holding device having a support surface for the wafer. The support surface is subdivided into at least two segments, each with a temperature influencing device. The temperature of each segment can be set independently to different temperatures. The integrated circuits are tested while thermal contact is made between the wafer and the support surface. Those integrated circuits which are in thermal contact with the first segment are tested while the segment is kept at an essentially constant temperature. The temperature of the second segment is at the same time varied. The second segment is then tested at the changed temperature.

4 Claims, 3 Drawing Sheets

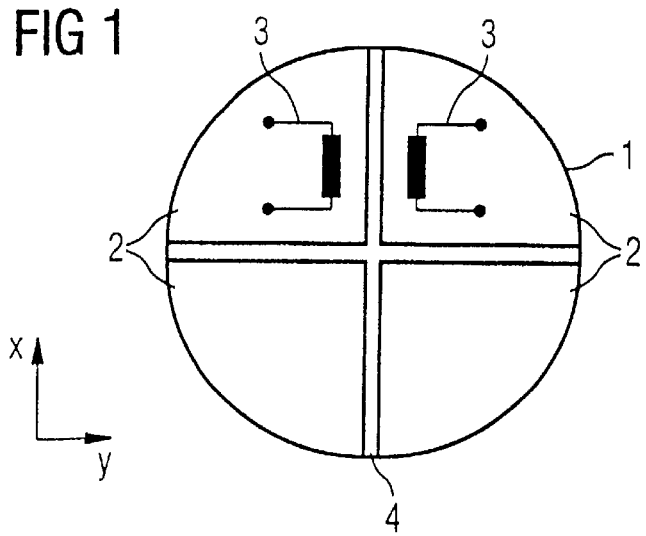
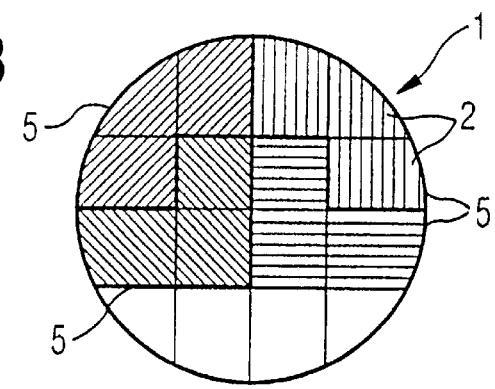
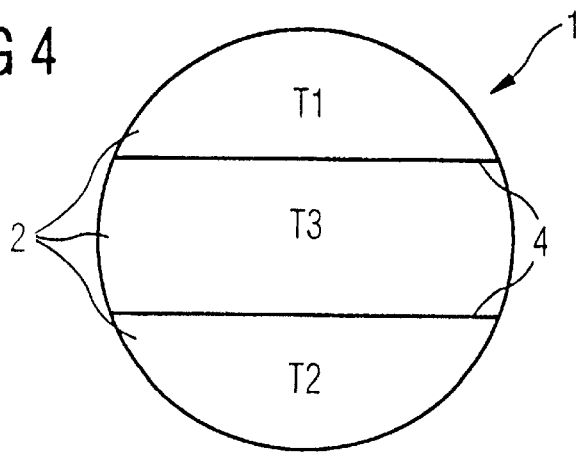

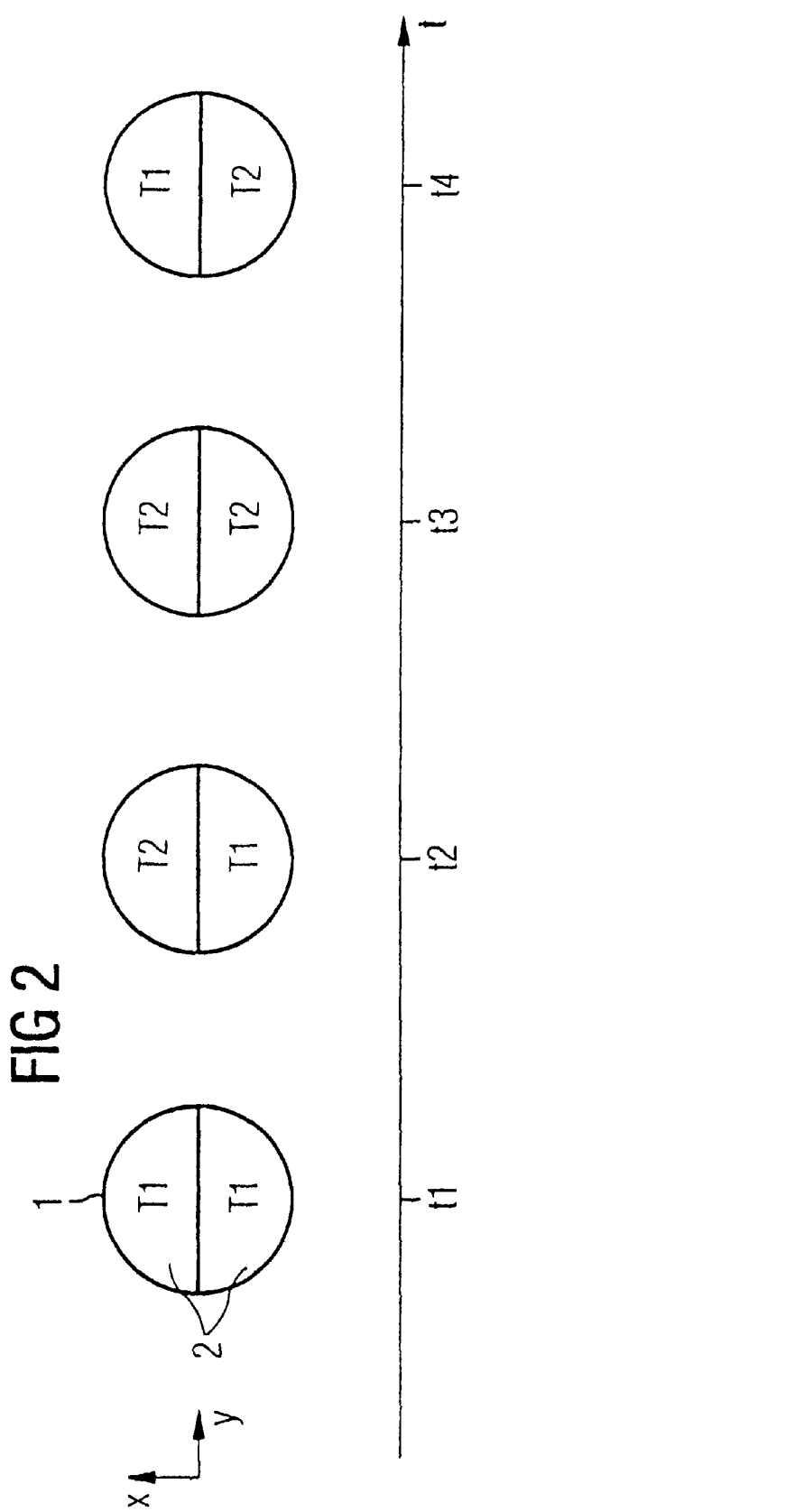

METHOD OF HOLDING A WAFER AND TESTING THE INTEGRATED CIRCUITS ON THE WAFER

BACKGROUND OF THE INVENTION

Field of the Invention

The invention lies in the field of semiconductor manufacture. Specifically, the invention relates to a holding device for a wafer and to a test method for integrated circuits on a wafer.

European patent application EP 0 465 017 A1 describes a holding device for a wafer, which includes a so-called wafer chuck (a wafer suction plate). The disk-shaped wafer, made of a semiconductor material, for example silicon, is placed on a support surface on the suction plate and is held firmly there by producing a vacuum. The vacuum is produced in annular structures in the support surface. Furthermore, a description is provided in that document of how the suction plate has further annular structures to which helium is supplied as a coolant. This is used to dissipate the high thermal energy which is produced during the testing of integrated circuits on the wafer, in order to prevent the destruction of the circuits. For the same purpose, the integrated circuits to be tested in each case, with which contact is made via test points, are supplied locally, from the side facing away from the chuck, with a further coolant. The supply is provided via the test probe having test points.

It is desirable to test all the integrated circuits on a wafer at different temperatures, for example at a minimum and a maximum temperature, since the circuits generally have to be serviceable over a specific temperature range in accordance with their specification. A typical maximum temperature is 90° C., a typical minimum temperature is −10° C. This therefore results in a relatively large temperature range of 100° C. In order to be able to test a wafer at these different temperatures in accordance with the European specification EP 0 465 017 A1, it is possible to set the temperature of the wafer as desired by selecting the temperature or the quantity of the helium supplied as coolant for each measuring operation, and then to test the integrated circuits on the wafer one after another. However, in order to set the wafer to the respective new temperature between the measurement passes (that is to say to cool down or heat up through 100° C.), a time interval which depends on the material of the wafer and on the material of the suction plate is needed. One restriction in that case is the heat storage capacity of the materials used, and a further restriction consists in the fact that in the event of excessively rapid temperature changes the circuits on the wafer could be damaged. A typical time for changing the temperature of a wafer of 200 mm diameter within the above-mentioned temperature range is 20 minutes. Since the total test time for all the integrated circuits on the wafer is 2.5 hours, for example, for one test pass, the time to change the temperature, during which the testing has to be interrupted, since the circuits are not then at the desired temperature, is quite crucial.

International PCT publication WO 96/11495 describes a wafer chuck having a heating device which is divided into two. The task of the heating device is to achieve a uniform temperature distribution over the entire wafer surface.

German patent DE 32 13 239 C2 describes a holding device for a wafer which has a large number of heating or cooling elements. These are used to compensate for a relative offset, brought about by a parameter change, between a mask which is held by a mask holder and a wafer which is arranged on the wafer support, by means of appropriate activation of the heating and/or cooling elements.

SUMMARY OF THE INVENTION

It is accordingly an object of the invention to provide a testing method and holding device for testing a wafer with integrated circuits, which overcomes the above-mentioned disadvantages of the heretofore-known devices and methods of this general type and which shortens or entirely eliminates the time for the above-mentioned temperature changes of the wafer between two test passes at different temperatures.

With the foregoing and other objects in view there is provided, in accordance with the invention, a method of testing integrated circuits on a wafer, which comprises:

placing a wafer with integrated circuits in thermal contact with a support surface of a wafer holding device, the support surface being divided into at least a first segment and a second segment;

testing respective integrated circuits in thermal contact with the first segment, maintaining a temperature of the first segment at a substantially constant first temperature, and simultaneously varying a temperature of the second segment; and after the second segment reaches a predetermined second temperature, testing the respective integrated circuits in thermal contact with the second segment.

The holding device has a support surface for the wafer, and the support surface is divided into at least two segments, each of which is assigned a temperature influencing device, which is used to independently set the temperature of the respective segment. The term "thermal contact" means that the wafer rests on the support surface. Those integrated circuits which are in thermal contact with the first segment are tested first, the segment is kept at an essentially constant temperature, while at the same time the temperature of the second segment is varied. After the changed temperature of the second segment has been reached, those integrated circuits which are in thermal contact with the second segment are tested.

The invention makes it possible to set at least two segments of the support surface or of the wafer to two different temperatures at the same time, so that the time needed for changing the temperature of a segment can run in parallel with the test time of another segment. The test time and the time to change the temperature are therefore contemporaneous rather than additive. In the most favorable case, the second segment has already reached the desired new temperature before the testing of the first segment has been completed. Testing at the new temperature can then be continued immediately. In turn, the first segment can then likewise be brought to the new temperature, in parallel with the testing of the second segment, and can thus be prepared for renewed testing.

The temperature influencing device may be a heating and/or a cooling device. A heating device may be implemented, for example, electrically by means of an appropriate heating winding, while a cooling device may be implemented by supplying a suitable cooling liquid or a suitable cooling gas.

As noted, the segmented support surface is a component part of a wafer suction plate, i.e., a wafer chuck. The wafer is held on the latter by means of a vacuum, so that simple handling is ensured and thermal contact is produced.

The thermal division of the support surface is best obtained in that a thermal insulation is provided between the segments of the support surface. This permits the setting of temperature differences, even at the segment boundaries. The support surface may be formed from a metal, and its thermal insulation from a ceramic material, so that good thermal isolation is achieved.

The support surface may be subdivided into the segments both horizontally and vertically, that is to say it may have segmentation in each of its two dimensions. This permits the presence of a large number of thermally isolated, controllable segments. A large number of segments permits the setting of smaller temperature differences between adjacent segments, so that the mutual temperature influence is only slight. For instance, the temperature may increase in intervals from segment to segment, when considered in one direction over the support surface. In this case, it is necessary only for the segments which are located furthest from each other to exhibit the actually required, maximum temperature difference.

In accordance with another feature of the invention, the method further comprises:

isolating the first segment and the second segment from one another with at least a third segment; and during a period in which the first segment is at the first temperature and the second segment is at the second temperature, maintaining the third segment at a third temperature between the first temperature and the second temperature, for instance at a temperature substantially midway between the first and second temperatures.

In this way, excessively large temperature differences, which can lead to damage to the circuits on the wafer or to the support surface itself, or to unacceptable mutual temperature influences between the segments, do not occur between two adjacent segments.

When a test is being carried out, firstly the entire support surface and thus the wafer are brought to a first temperature, and the circuits on the wafer are tested one after another. At the latest when the circuits above the last segment are being tested, a segment which is physically removed as far as possible from the latter is brought to a second temperature. The segments lying between these two have their temperatures controlled in such a way that the result is advantageously temperatures which rise at intervals from segment to segment between the first -named segments. While the last segment is still being tested at the first temperature, the other segment has already reached the second temperature, so that it is then possible to continue with the testing of the circuits arranged above the latter on the wafer, at the second temperature, without interruption. At the same time, the other segments are gradually also brought to the second temperature. Thus all the circuits can first be tested without interruption at the first temperature and can then be tested without interruption at the second temperature as well.

In accordance with an added feature of the invention, the support surface is subdivided into several segments, and the segments are provided with respective temperature influencing devices for independently setting a temperature of the segments. The following method steps are then prescribed:

combining a plurality of the segments into segment groups each covering a coherent area on the wafer support surface;

defining a number and a location of the combined segments and an area extent of the segment groups in dependence on a type of test to be carried out; and setting all of the segments of a respective segment group to the same temperature via their temperature influencing device during testing.

In other words, a number of the segments are combined to form several segment groups, the number and position of the combined segments, and therefore the area extent of the segment groups, being selected as a function of the type of test to be carried out. During the testing of the circuits on the wafer, the segments in each segment group are in each case controlled to the same temperature. The flexibly combinable segment groups provide the advantage that the separately temperature-controllable regions of the support surface can be adapted to the conditions predefined by the circuits on the wafer and the testing device used. For example, in order to carry out the test, contact is made between the circuits and test points on a pin board. Depending on the position of the contact areas on the circuits, and depending on the number of circuits with which contact is to be made at the same time, the pin board has a different number and arrangement of its test points. The invention now makes it possible, for example, to adapt to the pin board used and to its orientation in relation to the wafer, so that the segment groups can be adapted to these. It is thus possible for the same wafer to be tested by means of different pin boards having a different number of test points or a different number of chips with which contact is to be made simultaneously by the pin board, it being possible for the segment groups to be adapted to the respective pin board.

Other features which are considered as characteristic for the invention are set forth in the appended claims.

Although the invention is illustrated and described herein as embodied in a holding device for a wafer and test method for integrated circuits on a wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a plan view onto a first exemplary embodiment of a holding device according to the invention;

FIG. 2 is a diagrammatic view showing four temperature states, separated chronologically from each other along a time line, of a second exemplary embodiment of the invention;

FIG. 3 is a plan view onto another exemplary embodiment of the holding device;

FIG. 4 is a plan view onto a further exemplary embodiment; and

DESCRIPTION OF THE PREFERRED EMBODIMENTS

Figure 5:
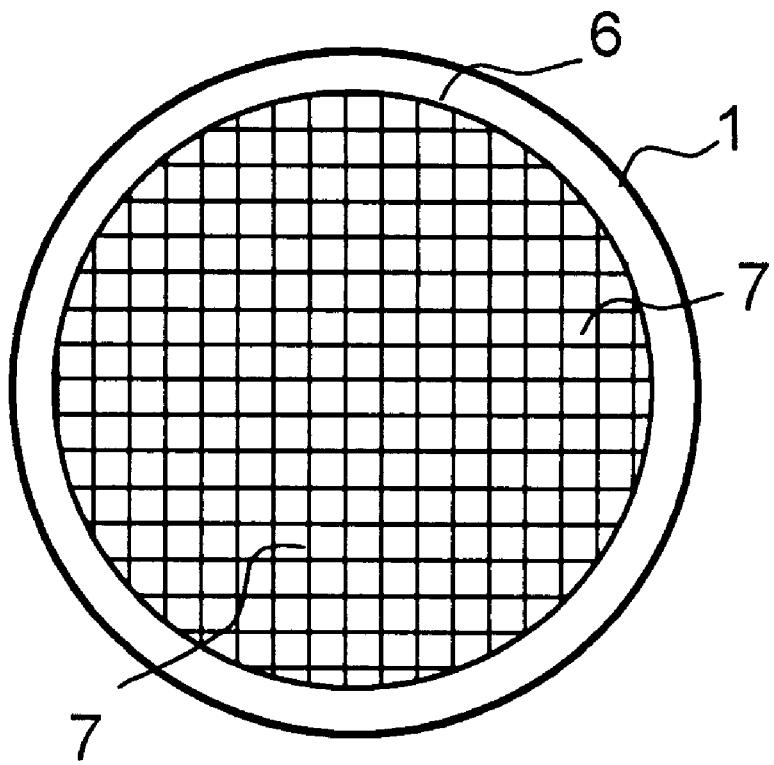
FIG. 5 is a plan view of a wafer on a wafer chuck.

Referring now to the figures of the drawing in detail and first, particularly, to FIG. 1 thereof, there is seen a support surface 1 of the wafer holding device, whose external dimensions are adapted to the shape of a wafer to be accommodated. The support surface 1 is part of a wafer chuck (i.e., a suction plate) which is not illustrated further, so that a wafer can be held by the chuck by vacuum by means of non-illustrated vacuum rings. In the first exemplary embodiment the support surface 1 is subdivided into four segments 2, each of which is assigned a temperature influencing device 3 (illustrated only for the two upper segments 2 in FIG. 1).

The temperature influencing devices 3, shown by way of example, are inter alia heating coils whose temperatures can be set independently of one another, so that the temperature of the individual segments can be selected independently of one another. In order to be able to cool the individual segments 2 as well, cooling channels for supplying a cooling liquid or a cooling gas to the support surface 1 are provided for each segment as further temperature influencing devices. The cooling channels are not illustrated for reasons of clarity. The cooling devices can also be controlled and regulated independently of one another.

Between the segments 2 in FIG. 1 there is a thermal insulation 4 made of a ceramic material. The support surface 1 is subdivided into the segments 2 both horizontally and vertically, that is to say in the X-direction and Y-direction in FIG. 1.

The test method according to the invention will be explained below with reference to FIG. 2. The figure illustrates four different temperature states of the support surface 1 of a second exemplary embodiment of the holding device at different times t1 to t4 along the time axis t. The time axis t is drawn in the lower part of FIG. 2. In the exemplary embodiment, the support surface 1 is only subdivided into two segments 2 in the vertical direction, that is to say the Y-direction. In order to carry out the test method, a wafer is first attracted by suction by the wafer suction plate, of which the support surface 1 is a component, so that the wafer subsequently lies on the support surface 1 and thermal contact with the latter is therefore made. The two segments 2 of the support surface, and with them the integrated circuits arranged above them on the wafer, are then heated to a first temperature T1 (for example +90° C.) by means of their temperature influencing devices 3 (time t1). Contact is then made, one after another, between the integrated circuits of the upper segment 2 and test points of a pin board, and the circuits are tested. The testing is continued by contact also being made between the integrated circuits of the lower segment 2 and the test points, and the circuits being tested.

During the testing of the lower segment 2, which is still at the first temperature T1, the upper segment is already being brought to a second temperature T2, which may be, for example, −10° C. When the testing of the lower segment is completed, at time t2, the upper segment has already reached the second temperature T2, so that contact may now be made again, without a pause, between the circuits of the upper segment and the test points, and the testing can be continued. The lower segment is now also cooled down, contemporaneously with the testing of the upper segment, from the first temperature T1 to the second temperature T2, which is reached at the time t3 before the testing of the upper segment is completed. While the testing in the lower segment is continued without interruption at the second temperature T2, the upper segment is reheated from the second temperature T2 to the first temperature T1, which is reached at the time t4, so that a second test pass of the wafer at the first temperature T1 can begin and the cycle, just outlined in four time phases, can begin again.

Referring now to FIG. 3, there is revealed a further exemplary embodiment of the holding device, in which the support surface 1 is subdivided into a larger number of segments 2. The segments 2 are combined into segment groups 5. The boundaries of the segment groups 5 are drawn more thickly in FIG. 3 than the horizontally and vertically subdivided segments 2. Each of the segment groups illustrated in FIG. 3 has three segments 2. For instance, the three segments 2 at the top left on the wafer form one of the segment groups 5. All of the segments in a segment group are at the same temperature during the testing. Since the segments 2 can be combined into the groups 5 as desired, merely by their temperature influencing devices 3 being activated appropriately, the position and extent of the segment groups can advantageously be adapted to the position and extent of the integrated circuits on the respective wafer to be tested and to the number of circuits with which contact is simultaneously to be made in each case by the test points of the pin board. It is thus possible for the support surface 1 to be adapted to the conditions predefined in each case by the wafer to be tested and by the pin board or test device used, by selecting the area extent of the segment groups.

A large number of segments 2 on the support surface 1 permits, on the one hand, the greatest possible flexibility in assembling the segment groups 5. On the other hand, this permits the stepwise setting of temperature differences between the segments in temperature intervals. Whereas specifically in FIG. 2, for reasons of clarity, the principle of the invention has been explained using a support surface 1 having only two segments 2, it is more advantageous to provide a larger number of segments 2. This will be explained with reference to FIG. 4.

FIG. 4 shows a support surface 1 which is subdivided into three segments 2 arranged one above another. The following advantage already results in the case of this support surface, which has been supplemented only by one additional segment with respect to FIG. 2: the uppermost segment can assume a first temperature T1, for example +90° C., and the lowest segment can assume a second temperature T2 of, for example, −10° C. The integrated circuits on the wafer are to be tested at these two temperatures. The central segment can be brought to a third temperature T3 between the two other temperatures T1, T2, such as, for example, 40° C. or 50° C. This avoids excessive temperature differences occurring at the segment boundaries. It is clear that, given a larger number of segments 2, further temperature steps can be set, so that the temperature differences at segment boundaries can be reduced further.

It will be understood that, with a large number of segments 2 or segment groups 5, and by setting the temperatures to rise from segment to segment, the temperature differences at the segment boundaries can be kept relatively small. In this case, therefore, temperature adaptation to the segment respectively previously tested is rapidly possible.

Since the testing of a segment 2 will generally take more time than changing its temperature to a new test temperature, it is beneficial to begin changing the temperature only when the test probe with the test pins has progressed as far as possible in the segment currently to be tested, so that the distance from the segment whose temperature is to be changed next is as great as possible. This may be clarified once more using FIG. 2. Between the times t1 and t2, changing the temperature of the upper segment 2 from the first temperature T1 to the second temperature T2 is started only when all the integrated circuits which are located on the boundary between the two segments have already been tested. This has the advantage that the mutual temperature influences (produced in spite of any insulation 4 which may be present) at the segment boundaries manifests itself less and less with increasing distance from these boundaries. Therefore, the integrated circuits arranged in the lower segment at the lower edge of the wafer can in fact be tested at the first temperature T1, while the upper segment has already reached the second temperature T2. For the same reason, at time t2 the testing is begun with those integrated circuits which are arranged at the upper edge of the upper segment and thus as far away as possible from the segment boundary. As the test progresses in the direction of the segment boundary, the lower segment can advantageously already be brought to the second temperature T2, so that the state which is shown for the time t3 is established as quickly as possible.

FIG. 5 illustrates a wafer 6 on a support surface of a wafer chuck 1. The wafer 6 has a plurality of chips 7 with integrated circuits.

I claim:

1. A method of testing integrated circuits on a wafer, which comprises:

placing a wafer with integrated circuits in thermal contact with a support surface of a wafer holding device, the support surface being divided into at least a first segment and a second segment;

testing respective integrated circuits in thermal contact with the first segment, maintaining a temperature of the first segment at a substantially constant first temperature, and simultaneously varying a temperature of the second segment; and after the second segment reaches a predetermined second temperature, testing the respective integrated circuits in thermal contact with the second segment.

2. The method according to claim 1, which further comprises:

subdividing the support surface into a plurality of segments, and providing each of the segments with a respective temperature influencing device for independently setting a temperature of the segment;

combining a plurality of the segments into segment groups each covering a coherent area on the wafer support surface;

defining a number and a location of the combined segments and an area extent of the segment groups in dependence on a type of test to be carried out; and setting all of the segments of a respective segment group to the same temperature via their temperature influencing device during testing.

3. The method according to claim 1, which further comprises:

isolating the first segment and the second segment from one another with at least a third segment; and during a period in which the first segment is at the first temperature and the second segment is at the second temperature, maintaining the third segment at a third temperature between the first temperature and the second temperature.

4. The method according to claim 3, which comprises defining the third temperature substantially midway between the first temperature and the second temperature.

* * * * *